(12) United States Patent
Lancaster et al.

(10) Patent No.: US 7,904,262 B2
(45) Date of Patent: Mar. 8, 2011

(54) CASCADING METROLOGY APPARATUS AND METHODOLOGY

(75) Inventors: Andrew Lancaster, Seneca, SC (US); Pierre Decaux, Clemson, SC (US)

(73) Assignee: Itron, Inc., Liberty Lake, WA (US)

( * ) Notice: Subject to any disclaimer, the term of this patent is extended or adjusted under 35 U.S.C. 154(b) by 863 days.

(21) Appl. No.: 11/473,391

(22) Filed: Jun. 23, 2006

(65) Prior Publication Data

US 2007/0073497 A1    Mar. 29, 2007

Related U.S. Application Data

(60) Provisional application No. 60/721,760, filed on Sep. 29, 2005.

(51) Int. Cl.
*G01R 21/00* (2006.01)

(52) U.S. Cl. .......................................... 702/62; 324/107

(58) Field of Classification Search .............. 702/60–62, 702/122, 187; 324/107, 108, 113, 114, 140 R, 324/141, 142, 140 D; 700/291, 295
See application file for complete search history.

(56) References Cited

U.S. PATENT DOCUMENTS

| | | | |
|---|---|---|---|
| 5,384,712 A | 1/1995 | Oravetz et al. | |
| 6,064,192 A | 5/2000 | Redmyer | |
| 6,274,950 B1 * | 8/2001 | Gottlieb et al. | 307/66 |
| 6,373,238 B2 | 4/2002 | Lewis et al. | |
| 6,671,636 B2 * | 12/2003 | Dawson | 702/62 |
| 6,836,737 B2 | 12/2004 | Petite et al. | |
| 2003/0105607 A1 * | 6/2003 | Jones et al. | 702/121 |

OTHER PUBLICATIONS

Pickering et al., "Design of Quantum-based Oversampling Delta-Sigma Analogue-to-Digital Converter for Metrology Applications", Sep. 4, 2004, IEE Proceedings—Science Measurement and Technology, vol. 151, No. 5, pp. 362-367.*

* cited by examiner

*Primary Examiner* — Manuel L Barbee
(74) *Attorney, Agent, or Firm* — Dority & Manning, P.A.

(57) ABSTRACT

Apparatus and methodology are provided for measuring energy, particularly in a useful way for a multiphase system. Individual, like single-phase metrology blocks are provided to monitor energy in selected phases of a multiphase system. Individual data from a relatively upstream metrology block is passed to a relatively downstream metrology block, with the data stream being concatenated as the stream tracks from one metrology block to another. Energy data is coded as a predetermined small quantum of energy such that the last metrology block in a seriatim configuration of such metrology blocks may compute total energy consumption in the effective multiphase system by simple addition of the energy quantum data arriving at such last metrology block.

10 Claims, 2 Drawing Sheets

CASCADING METROLOGY APPARATUS AND METHODOLOGY

PRIORITY CLAIM

This application claims the benefit of previously filed U.S. Provisional Patent Application entitled "CASCADING METROLOGY APPARATUS AND METHODOLOGY," assigned U.S. Ser. No. 60/721,760, filed Sep. 29, 2005, and which is incorporated herein by reference for all purposes.

FIELD OF THE INVENTION

The present subject matter relates generally to metrology. In particular, the present subject matter relates to apparatus and methodology for computing energy consumption of all phases in a multiphase system using one or more single-phase metrology blocks.

BACKGROUND OF THE INVENTION

A general object of metrology is to monitor one or more selected physical phenomena to permit creation of a record of monitored events. Such basic purpose of metrology can be applied to a variety of metering devices used in a number of contexts. One broad area of measurement relates, for example, to utility meters. Such role may also specifically include, in such context, the monitoring of the consumption or production of a variety of forms of energy or other commodities, for example, including but not limited to, electricity, water, gas, or oil.

More particularly concerning electricity meters, mechanical forms of registers have been historically used for outputting accumulated electricity consumption data. Such an approach provided a relatively dependable field device, especially for the basic or relatively lower level task of simply monitoring accumulated kilowatt-hour consumption.

The foregoing basic mechanical form of register was typically limited in its mode of output, so that only a very basic or lower level metrology function was achieved. Subsequently, electronic forms of metrology devices began to be introduced, to permit relatively higher levels of monitoring, involving different forms and modes of data.

In the context of electricity meters specifically, for a variety of management and billing purposes, it became desirable to obtain usage data beyond the basic kilowatt-hour consumption readings available with many electricity meters. For example, additional desired data included rate of electricity consumption, or date and time of consumption (so-called "time of use" data). Solid state devices provided on printed circuit boards, for example, utilizing programmable integrated circuit components, have provided effective tools for implementing many of such higher level monitoring functions desired in the electricity meter context.

In addition to the beneficial introduction of electronic forms of metrology, a variety of electronic registers have been introduced with certain advantages. Still further, other forms of data output have been introduced and are beneficial for certain applications, including wired transmissions, data output via radio frequency transmission, pulse output of data, and telephone line connection via such as modems or cellular linkups.

The advent of such variety and alternatives has often required utility companies to make choices about which technologies to utilize. Such choices have from time to time been made based on both philosophical points or preferences and/or based on practical points such as, training and familiarity of field personnel with specific designs.

Another aspect of the progression of technology in such area of metrology is that various retrofit arrangements have been instituted. For example, some attempts have been made to provide basic metering devices with selected more advanced features without having to completely change or replace the basic meter in the field. For example, attempts have been made to outfit a basically mechanical metering device with electronic output of data, such as for facilitating radio telemetry linkages.

Another aspect of the electricity meter industry is that utility companies have large-scale requirements, sometimes involving literally hundreds of thousands of individual meter installations, or data points. Implementing incremental changes in technology, such as retrofitting new features into existing equipment, or attempting to implement changes to basic components which make various components not interchangeable with other configurations already in the field, can generate considerable industry problems.

Electricity meters typically include input circuitry for receiving voltage and current signals at the electrical service. Input circuitry of whatever type or specific design for receiving the electrical service current signals is referred to herein generally as current acquisition circuitry, while input circuitry of whatever type or design for receiving the electrical service voltage signals is referred to herein generally as voltage acquisition circuitry.

Electricity meter input circuitry may be provided with capabilities of monitoring one or more phases, depending on whether monitoring is to be provided in a single or multiphase environment. Such variations in desired monitoring environments, however, lead to the requirement that a number of different metrology configurations be devised to accommodate the number of phases required or desired to be monitored.

As such, it is desired to provide a universal metrology block technology and associated data transmission methodology that permits the use of a single type of metrology block in several different monitoring environments, including either of single or multiphase systems.

Various disclosures concern designs relating to metrology and/or monitoring arrangements, including the following patents.

U.S. Pat. No. 6,671,636 B2 to Dawson, entitled "Apparatus, Method and Article of Manufacture for Utility Monitoring," discloses a utility monitoring arrangement wherein individual utility monitors can add its local utility data with the data of preceding utility monitors and transmit the combined data set to the next utility monitor in a serial sequence. The individual monitoring devices need not all be dedicated to monitoring the same type of utility but rather may collect data from various locations representing various consumables such as, but not limited to, electricity, water, and natural gas. Initiation of data transmission is apparently performed by a utility center or utility data collection device, which in turn parses the data for each such utility monitor rather than calculating total consumption based on data from previous utility monitors in a chain.

U.S. Pat. No. 6,064,192 to Redmyer, entitled "Revenue Meter With Integral Current Transformer," discloses a revenue meter with an integral current transformer (CT). The revenue meter is provided with a serial communication circuit that permits the meter CT to be daisy-chained with other meter CT's.

Additional examples of variously enabled electricity meters include U.S. Pat. No. 6,836,737 entitled "System And Method For Providing Remote Monitoring Of Consumption For A Utility Meter" by Petite, et al.; U.S. Pat. No. 6,373,238 entitled "Three-Phase Electrical Power Measurement System Including Three Transformers And A Measurement Circuit To Calculate The Power Thereof" by Lewis, et al.; and U.S. Pat. No. 5,384,712 entitled "Energy Monitoring System For A Plurality Of Local Stations With Snapshot Polling From A Central Station," by Oravetz, et al.

The disclosures of the foregoing United States patents are for all purposes hereby fully incorporated herein by reference hereto.

While various aspects and alternative embodiments may be known in the field of electricity metering, no one design has emerged that generally encompasses the herein-referenced characteristics and other desirable features associated with voltage acquisition in an electrical service and associated more generally with metering technology. More particularly, while various aspects and alternative features are known in the metering field, no one design has emerged generally integrating customer options based on modular meter configurations and corresponding methodologies as hereafter presented in accordance with the subject technology.

SUMMARY OF THE INVENTION

In view of the recognized features encountered in the prior art and addressed by the present subject matter, it is a present objective to provide improved methodology and corresponding apparatus for obtaining metering data. Still further, more particular present subject matter objectives relate to providing improvements in obtaining and/or transmitting metering data collected from plural locations and/or as based on plural sources of metering data.

Still further, the present subject matter relates to the provision of cascading single-phase metrology devices or blocks.

Additional present exemplary embodiments go beyond the previously-known concept of merely combining data from plural metrology blocks into a single, serial, data stream, so as to instead make use of the present subject matter relating to the serial streaming of quantum data coupled with processing by the addition of streamed data bits by the last of a group of metrology blocks or devices, so as to provide an overall multiphase energy consumption figure. In such exemplary embodiments, more broadly it is a present object to provide for cascading energy data in a multiphase metrology design obtained by using single-phase metrology blocks in accordance with the presently disclosed technology.

More particularly, it is a present object to provide for improved apparatus and corresponding methodology that accomplishes use of cascading data from single-phase metrology blocks to produce a multiphase metrology design. More particularly, exemplary present subject matter is directed to providing a plurality of single-phase metrology blocks in a "daisy-chain" topology configured such that the first metrology block in the chain initiates a synchronization header to enable the synchronization of the next metrology block in the chain. The data in such exemplary arrangements is sent downstream and includes the metrology block's own data concatenated with the data received from the previous block(s). Energy measured by such metrology blocks or devices in accordance with present subject matter is encoded in discrete quantum, i.e., very small amounts of energy, and the data is preferably transmitted from metrology block to metrology block along such a chain via a single wire. The last metrology block or device in such exemplary chain embodiment computes the energy of all upstream metrology blocks, thereby producing an output used to obtain data representative of the polyphase product.

Still further, in such exemplary embodiments, advantageously since such metrology blocks or devices generate quantum data instead of actual numbers, processing of the stream of successive "bits" of energy is very simple and does not require arithmetic and logic units but rather only a basic adder to compute the multiphase energy processing.

In an exemplary configuration, identical single-phase metrology blocks are configured for use in multiphase designs.

In one of present simpler forms, data received from a relatively upstream metrology block is combined with a local single-phase metrology block and is sent downstream to be combined with additional data from a subsequent metrology block. Another positive aspect of such present exemplary embodiment is that only one type of metrology block need be constructed to accommodate multiple metrology configurations for single or multiphase systems.

In accordance with aspects of certain embodiments of the present subject matter, methodologies are provided to simplify the downstream calculation of total energy consumption by providing quantum data from individual metrology blocks, thus reducing the computational requirements for a multiphase system.

In accordance with certain aspects of other embodiments of the present subject matter, methodologies have been developed to simplify data transmission requirements by reducing the number of signal lines required for data transmission in a multiphase configuration.

Additional objects and advantages of the present subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments and uses of the present subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents (including combinations of features, parts, or steps or configurations thereof not expressly shown in the figures or stated in the detailed description of such figures).

In one present exemplary embodiment, a metrology device is provided, comprising a first data combiner; a metrology board configured to produce energy related data; and a second data combiner. In such an exemplary embodiment, preferably the first data combiner is configured to serially combine data from a data source with data generated by such metrology board, while the second data combiner is configured to combine combined data from the first data combiner so as to provide composite energy related data.

In yet another present exemplary configuration, a multiphase metrology system is provided, comprising a plurality of metrology devices connected in seriatim, each of such metrology devices in turn comprising a first data combiner; a metrology board configured to produce energy related data; and a second data combiner. In such advantageous arrangement per the present subject matter, the first data combiner of each of the plurality of metrology devices is configured to combine data from a metrology device relatively upstream therefrom with energy related data generated by the metrology board, while the second data combiner is configured to optionally combine combined data from the first data combiner with further data.

It should be well understood by those of ordinary skill in the art that the present disclosure equally concerns both apparatus and corresponding methodology. For example, a further present exemplary embodiment relates to a method for monitoring energy, comprising the steps of providing a plurality of energy monitoring devices, each of such energy monitoring devices comprising a first data combiner, a metrology board for generating energy related data, and a second data combiner. Such exemplary methodology further comprises the steps of connecting the plurality of energy monitoring devices in a seriatim configuration; combining a signal from a first data combiner in a first of the plurality of energy monitoring devices in the seriatim configuration with energy related data from the metrology board of a second of the plurality of energy monitoring devices in the seriatim configuration; and determining total monitored energy by monitoring an output from the second data combiner in a second of the plurality of energy monitoring devices in the seriatim configuration.

Yet another exemplary methodology embodiment of the present subject matter relates to methodology for cascading data from single-phase metrology blocks to produce a multiphase metrology design. Such methodology may comprise the steps of providing a plurality of single-phase metrology blocks in a daisy-chain topology configured such that the first metrology block in the chain initiates a synchronization header to enable the synchronization of the next metrology block in the chain; sending data downstream from a metrology block so as to include such metrology block's own data concatenated with the data received from any previous metrology block, with energy measurements represented by the metrology blocks being encoded in discrete quantums of very small amounts of energy; and using the last metrology block in the daisy-chain topology to compute the energy of all upstream metrology blocks, thereby producing an output used to obtain data representative of the polyphase energy. With such methodology, processing of the stream of data does not require arithmetic and logic units but advantageously rather only a basic adder to compute the multiphase energy.

Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which.

Figure 1:
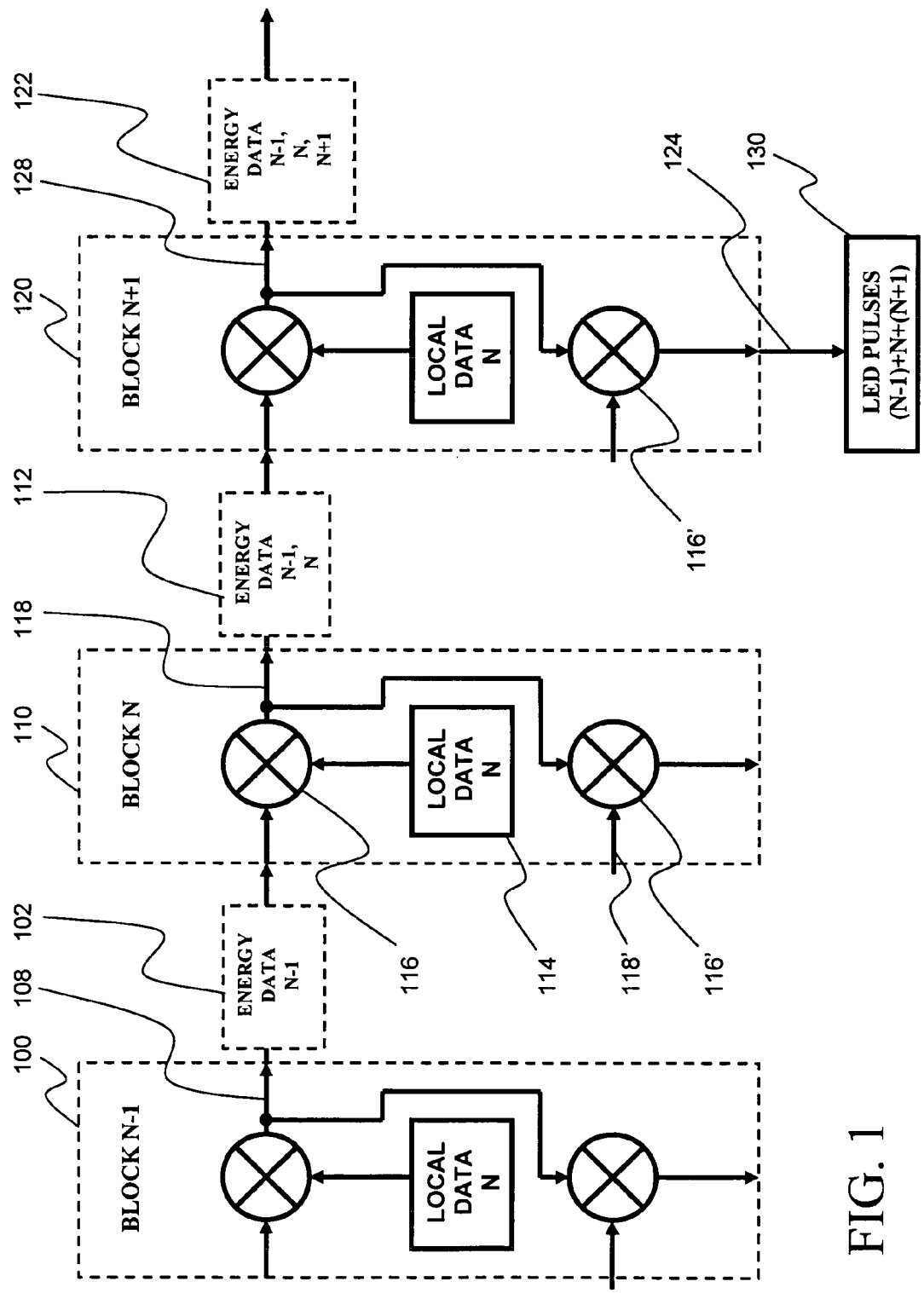
FIG. 1 representatively illustrates per present subject matter (both as to apparatus and methodology) the serial connection of a plurality of identical single-phase metrology blocks to provide multiphase metrology.

Repeat use of reference characters throughout the present specification and appended drawings is intended to represent same or analogous features, elements, or steps of the present subject matter.

DETAILED DESCRIPTION OF THE PREFERRED EMBODIMENTS

As discussed in the Summary of the Invention section, the present subject matter is particularly concerned both with improved apparatus and with improved methodology for metrology, particularly for cascading metrology single-phase metrology devices or blocks so as to obtain multiphase metrology data and/or for achieving other advantages therewith.

Selected combinations of aspects of the disclosed technology correspond to a plurality of different embodiments of the present subject matter. It should be noted that each of the exemplary embodiments presented and/or discussed herein should not insinuate limitations of the present subject matter. Features or steps illustrated or described as part of one embodiment (whether regarding apparatus or methodology) may be used in combination with aspects of another embodiment to yield yet further embodiments. Additionally, certain features may be interchanged with similar devices, features, or steps not expressly mentioned which perform the same or similar function.

Reference will now be made in detail to the presently preferred embodiments of the subject metrology system, and regarding corresponding methodology.

Referring now to the drawings, FIG. 1 illustrates an exemplary configuration of the present subject matter wherein a serial connection of a plurality of preferably identical single-phase metrology blocks or devices is provided to produce a multiphase metrology capability. As may be seen from FIG. 1, there are illustrated three exemplary metrology blocks 100, 110, and 120, respectively coupled for serial transmission of blocks of energy data 102, 112, and 122, respectively, over data lines 108, 118, and 128 using data transmission frames which are more fully described below with reference to FIG. 2, so as to provide data for a three-phase system.

It should be appreciated that the number of phases illustrated is not a limitation nor necessity of the present technology, because the present technology is directed, at least in part, to the concept of providing preferably duplicative single-phase blocks that may be coupled for data transmission in series in any number desired. The illustrated configuration of duplicative single-phase blocks may also be regarded as duplicative single-phase blocks provided in seriatim configuration or as being in a "daisy-chain" configuration, all with relative upstream and downstream relationships, as will be understood by those of ordinary skill in the art based on the complete disclosure of the present specification, claims and figures.

Figure 2:
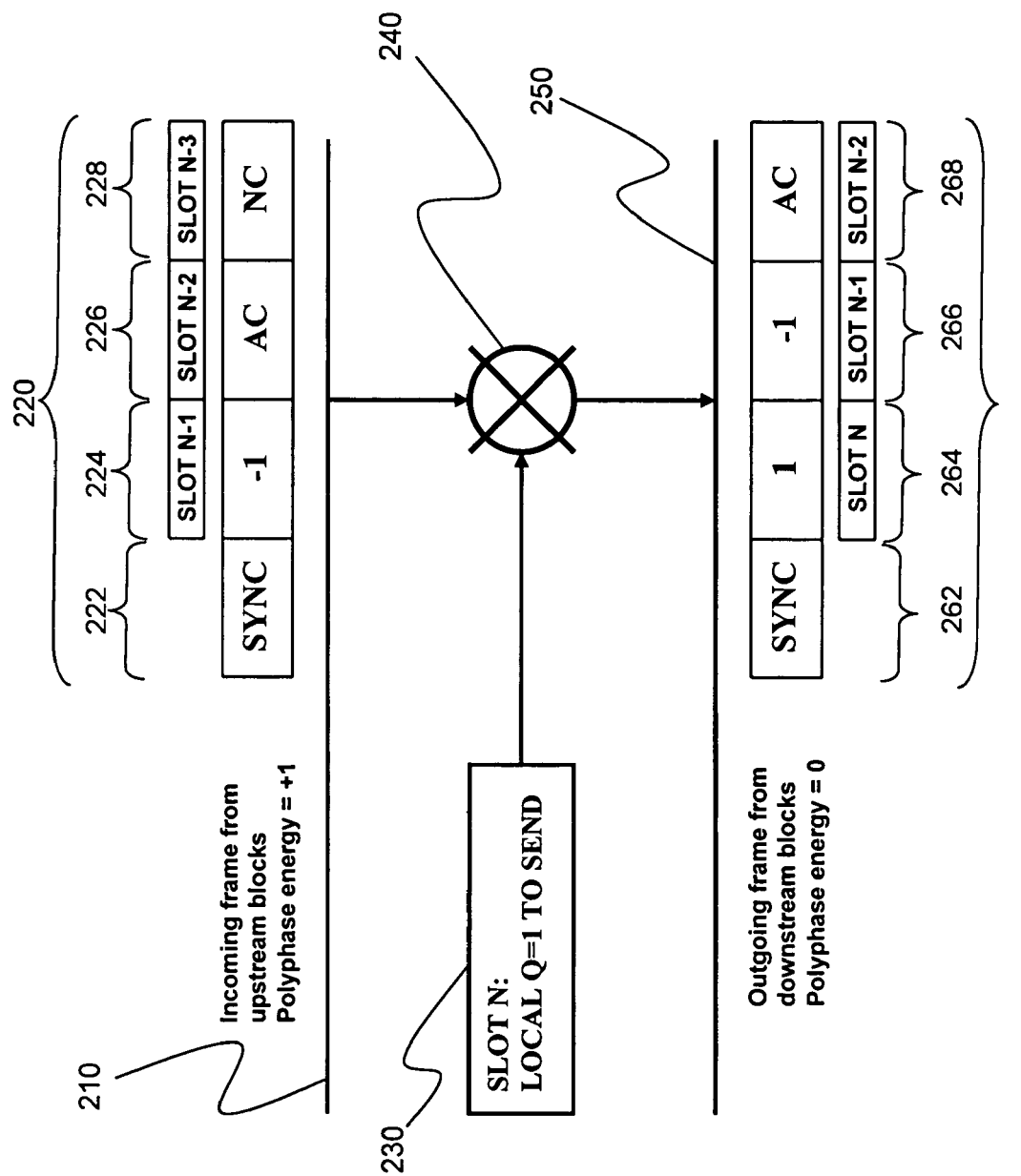
FIG. 2 illustrates per exemplary present methodology and exemplary apparatus, present aspects involving for combining local data from individual metrology blocks with upstream data.

With further reference to FIG. 1, metrology block 110, also denoted as "Block N," is effectively duplicated relatively upstream and illustrated with the representation of Block N−1 (100) while also being effectively duplicated relatively downstream and illustrated with the presentation Block N+1 (120). As illustrated, Block N−1 (100) collects and places on its associated communication line 108 its Local Data N as Energy Data N−1 (see representative reference character 102) for transmission to Block N (110). In turn Block N (110)

combines its collected Local Data N (see representative reference character 114) using an adder or summer 116, with the data stream from metrology block 100, in a fashion to be further described with relation to FIG. 2, and then passes such combined data 112 upstream to metrology block N+1 (see reference character 120). Finally, such metrology Block N+1 or device 120 combines its Local Data N with that of the previously combined data from Block N (110), so as to provide data 122 on respective line 128, as combined from all three blocks 100, 110, and 120 in the exemplary three-phase system here illustrated.

As may be seen and understood from such FIG. 1, each of such preferably identical metrology blocks or devices 100, 110 and 120 also includes a data combining element 116' that, in the "last" metrology block in such exemplary series or sequence of such blocks, may optionally be used to still further combine additional data via input line 118' with the combined data on line 128, as an LED pulse indication to a display device that may be associated with the last (or, in some embodiments, with each) metrology block of the sequence of blocks 100, 110 and 120.

In accordance with the present technology, the data transmitted from one relatively upstream metrology block to the next is combined into the serial data stream for retransmission to the next metrology block until such time as the combined data stream reaches the last block in a predetermined sequence of metrology blocks. Along this path, such combined and retransmitted data stream may also entail combining such data stream with the quantized energy of the receiving block, and in such fashion the receiving block's watt-hour pulse output advantageously can always reflect the total combined energy from itself and all upstream devices. The last block in a chain of metrology blocks may be configured to compute the energy of all upstream metrology blocks, as will be described further with reference to FIG. 2, and thus provide from cascaded single-phase metrology blocks the output used to obtain the energy consumption or generation of a polyphase product in real time. In the present instance, "real time" may be considered to correspond to a time frame of within a few hundred microseconds.

With reference now to FIG. 2, there is represented an exemplary methodology in accordance with present subject matter for combining local data from individual metrology blocks with data from upstream metrology blocks, if any, in a predetermined sequence of metrology blocks. A useful aspect of this exemplary embodiment of the present technology is than the measured energy is coded in discrete quantum. The energy quantum chosen is a very small amount of measured energy, generated for example at a relatively high frequency rate. Such preferred reporting of measured energy in small discrete quantum amounts allows a calibration process of such metrology blocks to count or meter energy with good resolution in a short time, giving good accuracy readings. In the present exemplary configuration, each quantum may be selected to be 1/2048 of the LED pulse used for product accuracy readings.

One aspect of preferably using energy quantum instead of an actual energy amount number is that processing of the stream of successive bits of energy advantageously becomes very simple as such processing does not require arithmetic and logic units but instead only a basic adder is needed to compute in effect the multiphase energy measurement.

Thus, for example, in a data stream, in accordance with present subject matter, the quantity "+1" may be used to indicate a positive quantum while the quantity "−1" may be used to indicate a negative quantum.

It should further be realized that per present methodology the measurements undertaken in accordance with the present technology might be used to measure either the generation of energy or the consumption of energy, or combinations of both generation and consumption. With this in mind, it may easily be seen that the positive or negative quantum advantageously may be viewed with respect to the particular environment within which the measurements of interest are to be taken.

With further reference to FIG. 2, the data combining aspects of an exemplary metrology block are illustrated starting with a representative data input line 210. Such data input line 210 may, in fact, preferably correspond to line 108 of FIG. 1 while representative data stream 220 may correspond to data stream 102 of FIG. 1 that representatively illustrated the energy data from Block N−1 (reference character 100) of FIG. 1.

As illustrated in such exemplary data stream 220, the data stream may be preferably segmented into at least four portions or time slots. A representative first slot 222 may correspond to a synchronization signal time slot. In a multiphase energy measuring system, the first metrology block in a predetermined sequence may be configured to initiate a synchronization (sync) signal to which the downstream metrology blocks may synchronize their operations so as to assure proper time slot insertion of their individual data bit.

As illustrated in present FIG. 2, the representative data stream 220 corresponds to the aforementioned sync signal 222 followed by further respective time slots 224, 226, and 228, each representing data slots from individual metrology board positions.

It should be understood from the present discussion that, in an exemplary instance that the illustrated data stream 220 is indicated as representative of a data stream that might be received at a second metrology board in a series of such metrology boards, data might not be contained in all slots of the data stream. Moreover, as is the case here illustrated, specialized data may be inserted in selected of the time slots, thereby signifying special circumstances.

As an example of such potential specialized data bits in accordance with present subject matter, it may be noted that in slot 226 of FIG. 2 (labeled as Slot N−2), there appears a designation of "AC." Such exemplary data value is a representative designation of an "anticreep" value, i.e., a value indicating that there is no current flow in the metrology board designated by that particular time slot. In addition, in time slot 228 there appears an exemplary designation of "NC", which in this instance is intended to represent a data value chosen to indicate that there is no metrology board connected in the corresponding or represented time slot. Additional specialized designations may be provided as required or as desired, and may include such designations as "IDLE" indicating that a metrology block is connected but has no quantum to send. Another example is the designation "ER" as indicating that an error has occurred. Other designations may, of course, be provided per present subject matter as necessary or desirable, based on desired system operation or constraints.

Further referring to FIG. 2, as metrology block 110 (FIG. 1) develops its local data (presently represented in FIG. 2 as metrology block 230 and "Slot N", respectively) the data generated is concatenated with the data received in data line 210 by representative data combiner 240, so as to produce exemplary resulting data stream 260 on representative output data line 250. As may be seen in the exemplary configuration presently represented, a data value of "+1" corresponding to a positive quantum may be indicated as measured by metrology block 110 in Slot N. Thus, as represented by data stream 260, such first slot 264 after an exemplary representative sync slot 262 now contains data representing the positive quantum of energy measured at Slot N, as reflected by the positive "1" designation shown.

Similarly, in slot N−1 is illustrated a negative energy quantum "−1" corresponding to the "−1" designation of Slot N−1 as it appeared on incoming data line 210 but now shifted to the exemplary second slot 266 after the sync slot 262 in the representative output data stream on line 250. In like manner, the previous input data line 210 data slot occupying the second slot 226 after the sync slot 222 has been shifted to the representative third slot 268 after the sync slot 262 in the output data stream on line 250.

Such process of concatenating data from a local data metrology block or device (or board) to previously received data continues until the last metrology block/device/board in the predetermined sequence of such metrology apparatuses is reached. When the last such metrology apparatus in the predetermined sequence concatenates its local data to the previously received data, a measure of the polyphase energy can be produced in accordance with the present subject matter by simple addition of the values stored in each slot of the last data stream. As illustrated herein, assuming that representative data stream 260 is the last data stream, the polyphase energy measured would correspond to zero based on the summation of the single "+1" value in slot 264 and the single "−1" value in slot 266.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for monitoring energy, comprising:
    providing a plurality of single phase energy monitoring devices, each of such single phase energy monitoring devices comprising a first data combiner, a single phase metrology board for generating single phase energy related data, and a second data combiner;
    connecting the plurality of single phase energy monitoring devices in a seriatim configuration;
    combining a signal from a first data combiner in a first of the plurality of single phase energy monitoring devices in the seriatim configuration with energy related data from the single phase metrology board of a second of the plurality of single phase energy monitoring devices in the seriatim configuration; and
    determining total multiphase monitored energy by monitoring an output from the second data combiner in a second of the plurality of single phase energy monitoring devices in the seriatim configuration.

2. A method for monitoring energy as in claim 1, wherein the single phase energy related data provided by each single phase metrology board comprises energy consumption data.

3. A method for monitoring energy as in claim 1, wherein the energy related data provided by each metrology board comprises energy generation data.

4. A method for monitoring energy as in claim 1, further comprising:
    concatenating data from a first data combiner in a first of the plurality of single phase energy monitoring devices in the seriatim configuration with data from a first data combiner in a second of the plurality of single phase energy monitoring devices in the seriatim configuration.

5. A method for monitoring energy as in claim 4, further comprising:
    configuring each of the single phase metrology boards to provide energy related data corresponding to energy quantum data.

6. A method for monitoring energy as in claim 4, further comprising:
    configuring the first single phase metrology device of the plurality of single phase metrology devices in the seriatim configuration to initiate a synchronization signal to synchronize the single phase metrology blocks in the seriatim configuration relatively downstream therefrom.

7. A method for monitoring energy as in claim 4, further comprising:
    configuring the last single phase metrology device of the plurality of single phase metrology devices in the seriatim configuration to algebraically add the concatenated data to produce data related to multiphase energy consumption.

8. A method for monitoring energy as in claim 4, further comprising:
    supplying additional data to one or more of the second data combiners of the plurality of single phase energy monitoring devices in the seriatim configuration.

9. Methodology for cascading data from single-phase metrology blocks to produce a multiphase metrology design, comprising the steps of:
    providing a plurality of single-phase metrology blocks in a daisy-chain topology configured such that the first metrology block in the chain initiates a synchronization header to enable the synchronization of the next metrology block in the chain;
    sending data downstream from a metrology block so as to include such metrology block's own data concatenated with the data received from any previous metrology block, with energy measurements represented by the metrology blocks being encoded in discrete quantums of very small amounts of energy; and
    using the last metrology block in the daisy-chain topology to compute the energy of all upstream metrology blocks, thereby producing an output used to obtain data representative of the multiphase energy, such that processing of the stream of data does not require arithmetic and logic units but rather only a basic adder to compute the multiphase energy.

10. Methodology for cascading data from single-phase metrology blocks to produce a multiphase metrology design as in claim 9, wherein the data is transmitted from metrology block to metrology block along the daisy-chain configuration via a single wire.

* * * * *